(12) United States Patent
Nohara et al.

(10) Patent No.: US 6,606,772 B1
(45) Date of Patent: Aug. 19, 2003

(54) METHOD FOR MANUFACTURING PIEZOELECTRIC OSCILLATOR (75) Inventors: Yasuhiro Nohara, Chiba (JP); Masayoshi Shiraishi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/493,761

(22) Filed: Jan. 28, 2000

(30) Foreign Application Priority Data

| Jan. 29, 1999 | (JP) | 11-023085 |
| Mar. 25, 1999 | (JP) | 11-082108 |
| Jan. 27, 2000 | (JP) | 2000-019218 |

(51) Int. Cl.[7] .............................................. H04R 17/00
(52) U.S. Cl. ................. 29/25.35; 29/840; 29/843; 29/847; 29/846; 29/896.2; 29/896.22; 310/321; 310/324; 310/344; 310/348
(58) Field of Search ....................... 29/25.35, 840, 29/847, 843, 846, 896.2, 896.22; 310/321, 324, 344, 348

(56) References Cited

U.S. PATENT DOCUMENTS

| 4,005,321 A | * | 1/1977 | Shibata et al. | 310/9.1 |
| 4,099,078 A | * | 7/1978 | Shibata et al. | 310/361 |
| 4,176,030 A | * | 11/1979 | Negita | 204/192 |
| 4,205,248 A | * | 5/1980 | Negita | 310/370 |
| 4,232,109 A | * | 11/1980 | Kizaki | 430/312 |
| 4,235,036 A | * | 11/1980 | Kizaki | 310/360 |
| 4,266,156 A | * | 5/1981 | Kizaki | 310/344 |
| 4,320,320 A | * | 3/1982 | Momosaki | 310/361 |
| 4,349,763 A | * | 9/1982 | Hoshi | 310/370 |
| 4,377,765 A | * | 3/1983 | Kogure | 310/312 |
| 4,421,621 A | * | 12/1983 | Fujii | 204/192 |
| 4,520,374 A | * | 5/1985 | Koto | 346/140 |
| 4,639,631 A | * | 1/1987 | Chason | 310/344 |
| 5,235,237 A | * | 8/1993 | Leonhardt | 310/329 |
| 5,265,316 A | * | 11/1993 | Ikeda | 29/25.35 |
| 5,325,574 A | * | 7/1994 | Takagi | 29/25.35 |
| 5,373,267 A | * | 12/1994 | Kaida | 333/187 |
| 5,373,269 A | * | 12/1994 | Kaida | 333/187 |
| 5,392,006 A | * | 2/1995 | Ikea | 331/158 |
| 5,396,042 A | * | 3/1995 | Ishida et al. | 219/78.02 |
| 5,504,460 A | * | 4/1996 | Ikeda | 331/158 |
| 5,513,431 A | * | 5/1996 | Ohno et al. | 29/890.1 |
| 5,541,557 A | * | 7/1996 | Ikeda | 331/158 |
| 5,592,130 A | * | 1/1997 | Ikeda | 331/158 |
| 5,607,236 A | * | 3/1997 | Takagi | 374/117 |
| 5,771,555 A | * | 6/1998 | Eda | 29/25.35 |
| 5,837,562 A | * | 11/1998 | Cho | 438/51 |
| 5,889,357 A | * | 3/1999 | Yachi | 310/344 |
| 5,896,150 A | * | 4/1999 | Kobayashi | 347/71 |
| 5,918,354 A | * | 7/1999 | Ikegami | 29/25.35 |
| 5,925,973 A | * | 7/1999 | Eda | 310/348 |
| 6,087,759 A | * | 7/2000 | Pfeil | 310/321 |
| 6,285,063 B1 | * | 9/2001 | Splett | 257/415 |

* cited by examiner

*Primary Examiner*—A. Dexter Tugbang
*Assistant Examiner*—Paul Kim
(74) *Attorney, Agent, or Firm*—Adams & Wilks (57) ABSTRACT

A method is provided for fabricating a piezoelectric vibrator without degrading vibration characteristics. The piezoelectric vibrator has a vibration plate formed with a piezoelectric vibration portion and a frame portion integrally connected with a base portion of the piezoelectric vibration portion and surrounding the piezoelectric vibration portion. Opposite surfaces of the piezoelectric vibration plate are provided with a pair of lid members bonded to hermetically seal the piezoelectric vibration portion without interfering with vibration thereof. To achieve the bonding, a metal film is coated over substantially the entire area of opposite surfaces of the piezoelectric vibration plate. The metal film is patterned to form oscillation electrode films on opposite surfaces of the piezoelectric vibration portion and to form bonding films on opposite surfaces of the frame portion for bonding the frame portion to the pair of lid members.

21 Claims, 7 Drawing Sheets

METHOD FOR MANUFACTURING PIEZOELECTRIC OSCILLATOR

BACKGROUND OF THE INVENTION

The present invention relates to a manufacturing method of a piezoelectric vibrator having a piezoelectric vibration piece hermetically sealed by lid members, and more particularly to a manufacturing method of a piezoelectric vibrator using anodic bonding.

Figure 7:
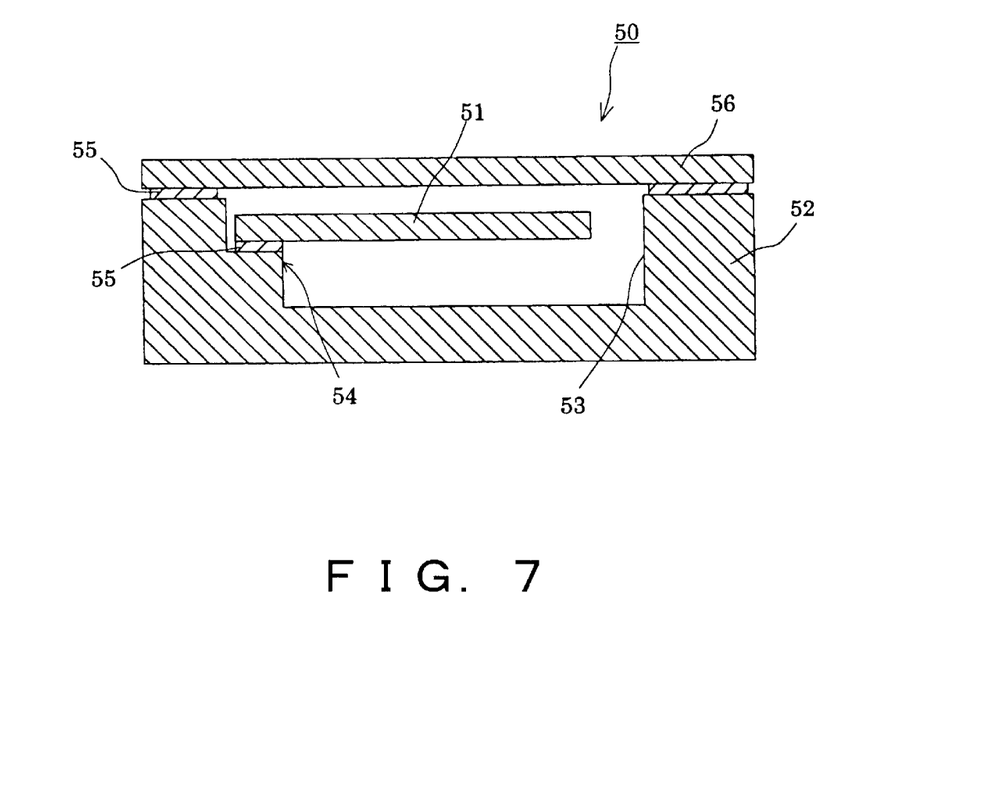
FIG. 7 is a sectional view of a piezoelectric element according to a prior art.

As shown in FIG. 7, a conventional surface-mount type piezoelectric vibrator 50 is comprised of a piezoelectric vibrator piece 51, a container 52 fixing one end of the piezoelectric vibration piece 51, and a lid member 56 for sealing the container 52.

The container 52 fixed with the piezoelectric vibration piece 51 has a concave portion 53 defining a space sufficiently large to an extent not interfering with vibration of the piezoelectric vibration piece 51. In this concave portion 53 a step portion 54 is provided having a smaller depth than other portions. The piezoelectric vibration piece 51 is fixed on a top surface of the step portion 54 of the container 52 through an adhesive layer 55, such as a solder material or conductive adhesive. The container 52 is bonded thereon with the lid member 56 through a similar adhesive layer 55 used for fixing of the piezoelectric vibration piece 51, thus hermetically sealing the piezoelectric vibration piece 51 within the concave portion 53 of the container 52.

However, where a solder material is used as an adhesive layer 55 to bond the piezoelectric vibration piece 51 and the lid member 56, bonding is made by thermally fusing the solder member and accordingly gas is produced due to the fusing. Because the gas will be filled within the hermetically-sealed concave recess 53 of the container 52, there is the problem that an electrode film of the piezoelectric vibration piece 51 causes chemical change such as oxidation thus having an effect upon reliability of the piezoelectric vibrator.

Meanwhile, where a conductive adhesive is used as an adhesive layer 55, gas is produced due to an epoxy resin upon thermosetting thus resulting in a problem having a bad effect upon the piezoelectric vibration piece similarly to the solder material.

Furthermore, there is a possibility that such a gas occurs to heating in mounting process, particularly in a reflow process or during environmental testing, after completing production of a piezoelectric vibrator.

The present invention has been made in view of such a circumstance, and it is an object to provide a manufacturing method of a piezoelectric vibrator which is free from lowering of piezoelectric vibrator characteristic.

SUMMARY OF THE INVENTION

A first aspect of the present invention for solving the above problem lies in, in a manufacturing method of a piezoelectric vibrator having a piezoelectric vibration plate having a piezoelectric vibration piece and a frame portion integrally connected with a base portion thereof and surrounding the piezoelectric vibration piece, on respective sides of which a pair of lid members are bonded to hermetically seal the piezoelectric vibration piece without interfering with vibration of the piezoelectric vibration piece, the manufacturing method of the piezoelectric vibrator comprising a step of: forming a metal film generally over an entire surfaces of respective surfaces of the piezoelectric vibration plate; patterning the metal film to form oscillation electrode films on both surfaces of the piezoelectric vibration piece and forming bonding films to be bonded to the pair of lid members in a corresponding area to the both surfaces of the frame portion; and laminating the piezoelectric vibration plate and the pair of lid members through the bonding films on both surfaces of the frame portion of the piezoelectric vibration plate by applying a temperature of 100–200° C. and applying a voltage of 0.5–5.0 kV to the lid members and the bonding films with the piezoelectric vibration plate side rendered as an anode.

A second aspect of the invention lies, in that in the first aspect, the lid members are formed of soda-lime glass and the metal film is formed of an aluminum alloy.

In the above invention, it is possible to form a piezoelectric vibration plate and lid members through a bonding film positively and easily.

DETAILED DESCRIPTION OF THE PREFERRED EMBODIMENTS

Embodiments of the present invention will now be described with reference to the drawings.

Figure 1:
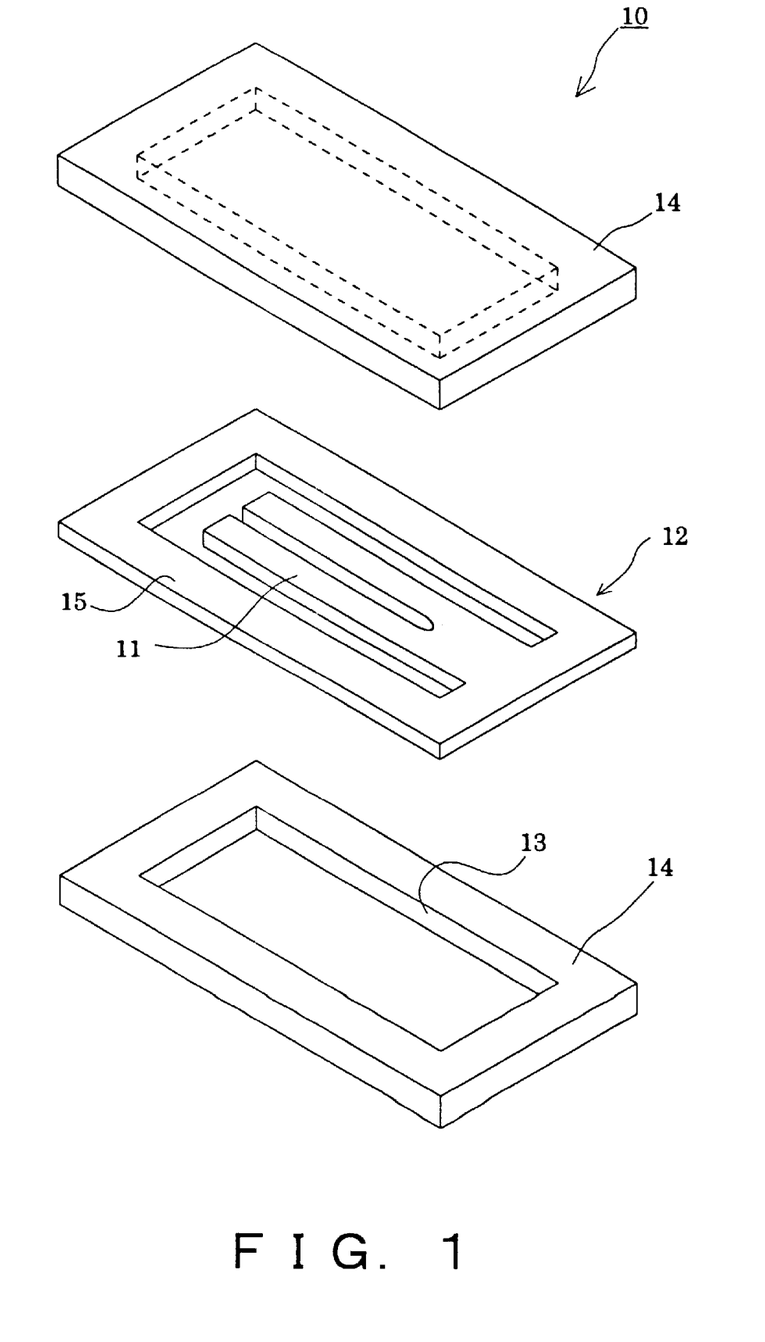
FIG. 1 is an exploded perspective view of a piezoelectric vibrator according to one embodiment of the present invention.
Figure 2:
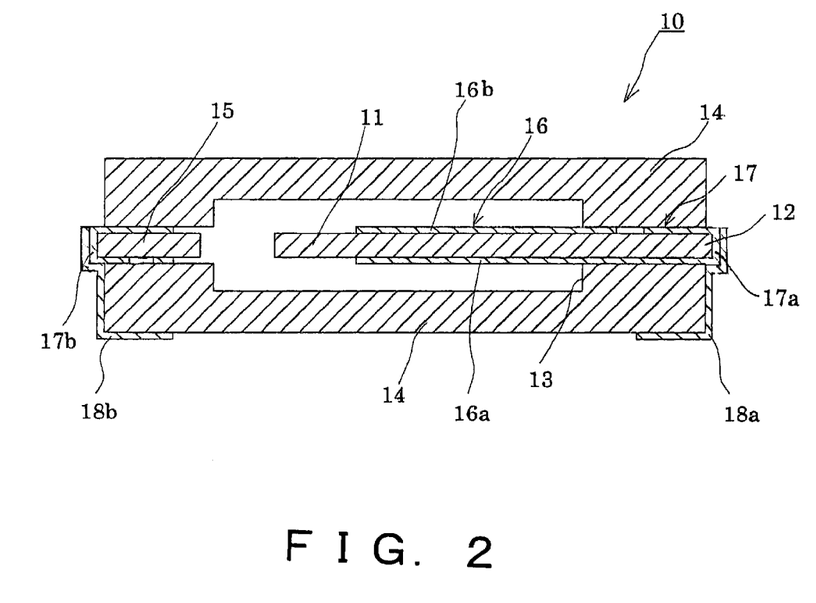
FIG. 2 is a sectional view of a piezoelectric vibrator according to the one embodiment of the invention.

FIG. 1 is an exploded perspective view showing one embodiment of a piezoelectric vibrator, and FIG. 2 is a sectional view thereof.

A piezoelectric vibrator of this embodiment is, for example, a quartz crystal vibrator having a tuning fork type quartz crystal vibration piece formed of quartz ($SiO_2$). As shown in the FIG. 1, the piezoelectric vibrator is made up by a quartz crystal plate 12 having a quartz crystal vibration piece 11, and a pair of lid members 14 to be bonded onto respective surfaces of the quartz crystal plate 12 to hermetically seal the quartz crystal vibration piece 11 for vibration.

The quartz crystal plate 12 of this embodiment has the tuning fork type quartz crystal vibration piece or tine 11 and a frame portion 15 connected integrally with a base portion thereof in a manner surrounding the quartz crystal vibration piece 11.

The pair of lid members 14 are each formed, for example, of soda-lime glass or the like and have a concave portion or recess 13 to define a space large enough to an extent so as not to prevent vibration of the quartz crystal vibration plate 11 and formed an area in corresponding to the quartz crystal vibration piece 11.

Also, as shown in FIG. 2, the quartz crystal plate 12 has oscillation electrode films 16 formed on its top and bottom both surfaces and side surfaces thereof to vibrate the quartz crystal vibration piece 11, and also has bonding films 17 formed of the same material as the oscillation electrode films 16 in corresponding areas to both surfaces of the frame 15 to provide actual bonding to the lid members 14. This bonding films 17 and the lid members 14 are bonded by so-called anodic bonding, as hereinafter described in greater detail, thereby providing bonding between the quartz crystal plate 12 and the lid members 14.

Also, the oscillation electrode film 16 extends to an end of the quartz crystal plate 12 and is connected with the bonding film 17. In this embodiment, the oscillation electrode films 16 have one pole electrode 16a connected to a lead electrode 18a through a terminal connection bonding film 17a. Also, the other electrode 16b extends to a terminal connection bonding film 17b through an electrode provided for connection on the side surface of the quartz vibration piece 11, and is connected to a lead electrode 18b.

Incidentally, at least part of the bonding films 17 formed on the respective surfaces of the quartz crystal plate 12 are formed respectively to surround the concave portions 13 on both surface. This, after bonding, provides hermetic seal to the concave portions 13.

Hereunder, an explanation is made of a manufacturing, process for the quartz crystal resonator constructed as described above. Incidentally, FIG. 3 is a perspective view illustrating a manufacturing process for the piezoelectric vibrator according to the embodiment.

Figure 3A:
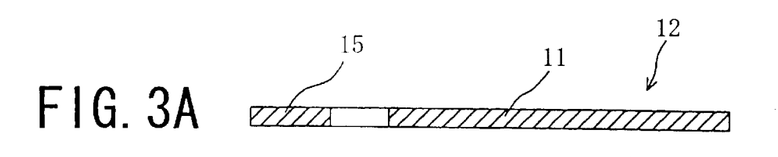
FIG. 3 is a sectional view showing a manufacturing process for a piezoelectric vibrator of the invention.

First, as shown FIG. 3A, a quartz wafer to be formed into a quartz crystal plate 12 is etched to form a quartz crystal vibration piece 11 as an actual driving portion and a frame 15 surrounding the same.

Figure 3B:
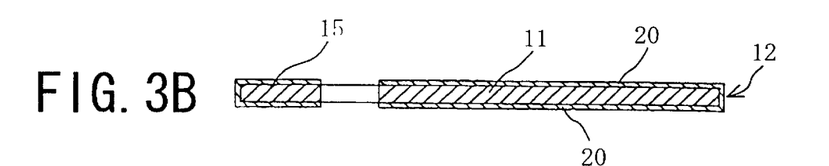

Next, as shown in FIG. 3B, a metal film 20 is formed by sputtering or the like over almost the entire area of the respective surfaces of the quartz crystal plate 12. This metal film 20 is a film serving as an oscillation electrode film 16 for vibrating the quartz crystal vibration piece 11 and bonding films 17 used as actual bonding portions for bonding the frame to the lid members 14. The material of the metal film is not especially limited but preferably uses, for example, an aluminum alloy or the like.

Figure 3C:
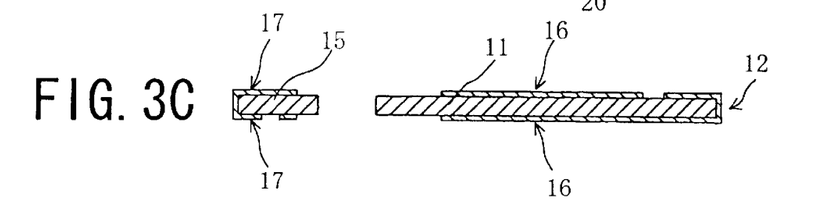

Next, as shown in FIG. 3C, the metal film 20 is patterned to form oscillation electrode films 16 and a surrounding bonding film 17 in an entire peripheral area corresponding to the frame 15.

Figure 4:
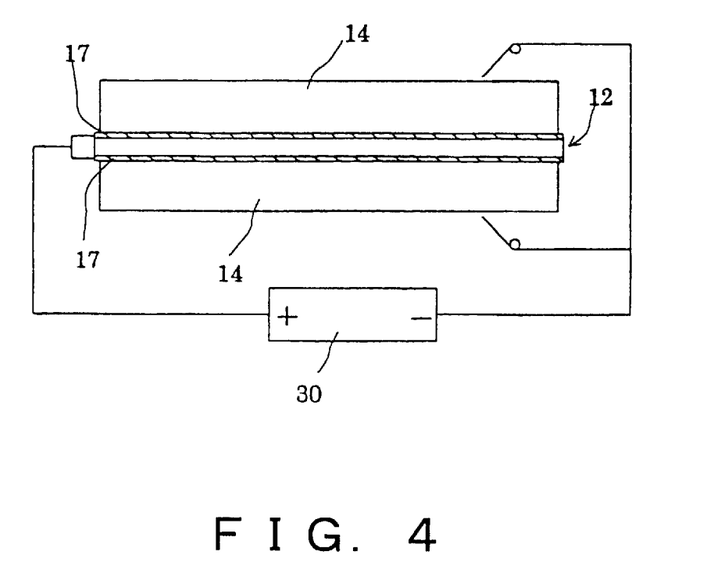
FIG. 4 is a schematic view showing a manufacture process for a piezoelectric element of the invention.

Next, as shown in FIG. 4, lid members 14 are bonded onto the opposite surfaces of the quartz crystal resonator 10 through the bonding films 17 by anodic bonding in an inert gas or vacuum, hermetically sealing the quartz crystal vibration piece 11 within the respective concave portions 13 of the lid members 14. At this time, it is preferred that the members are heated within the range 100 to 200° C. and a direct current voltage of 0.5 to 5.0 kV is applied to the bonding films 17 on the respective surfaces of the quartz crystal plate 12 and the lid members 14 by a direct current power source 30 such that an anode electrode is on the bonding films 17 side. For example, in this embodiment, the members were heated up to approximately 120° C. and a direct current voltage of about 3.5 kv was applied.

In this manner, the bonding films 17 and the lid members 14 are well bonded by anodically bonding between the quartz crystal plate 12 and the lid members 14 through the bonding films 17 under the conditions as described above. That is, the quartz crystal plate 12 and the lid members 14 are well bonded through the bonding films 17 without causing cracks or the like.

Here, quartz as a material of the quartz crystal plate 12 has a thermal expansion coefficient of 13.7 ppm/° C. while soda-lime glass used for the lid members 14 has a thermal expansion coefficient of 8.5 ppm/° C. That is, these materials have a comparatively great difference in thermal expansion coefficient, i.e. 5.2 ppm/° C., and are difficult to anodically bond under the conventionally-known condition. However, in the present embodiment anodic bonding is made at a low bonding temperature of approximately 100 to 200° C. and by applying a comparatively high direct current voltage of about 0.5 to 5.0 kV. This reduces the effect of thermal expansion coefficient to an extremely small amount, thus preferred bonding is possible even for members that are comparatively large in thermal expansion coefficient.

Incidentally, in an actual process, bonding is made between a quartz wafer formed with a plurality of quartz crystal vibration pieces 11 and lid forming members formed with a plurality of lid members 14 having concave portions or recesses 13 in the corresponding area to the quartz crystal vibration piece 11 and thereafter cutting is performed at predetermined positions into individual quartz crystal resonators.

As described above, in the present embodiment anodic bonding is made between the quartz crystal plate 12 and the lid members 14 through the bonding films to seal the quartz crystal vibration piece 11. Accordingly, degassing or the like does not occur and there is no fear of lowering in vacuum. Meanwhile, because the oscillation electrode films 16 and the bonding films 17 are formed in the same material, they can be formed at the same time thereby simplifying the manufacturing process.

Figure 5:
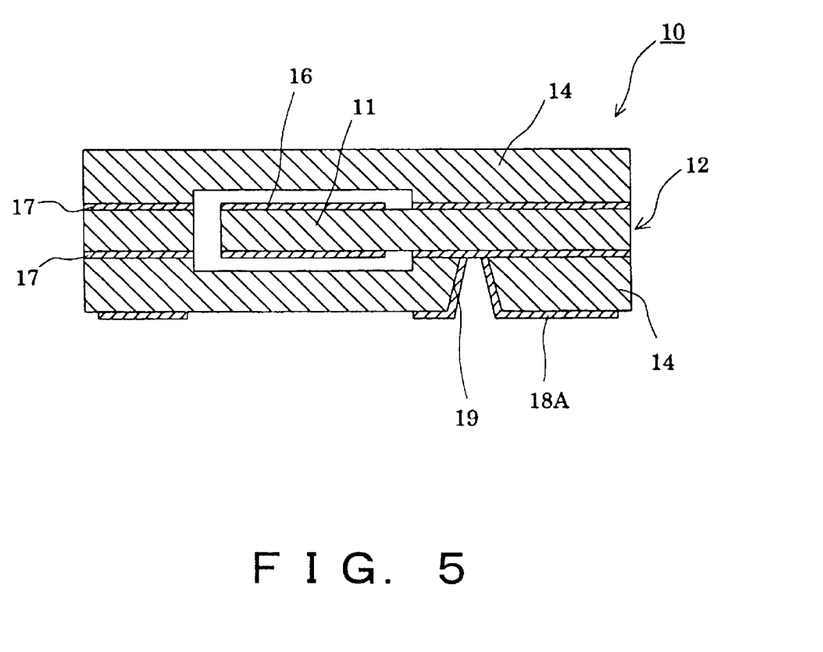
FIG. 5 is a sectional view showing another example of a piezoelectric vibrator according to the invention.

Incidentally, although in the above embodiment the oscillation electrode films 16 were extended to the end of the quartz crystal plate 12 and connected to the lead terminals 18a and 18b the invention is not limited to this structure. For example, as shown in FIG. 5, a formed in the hole 19 through thickness direction for example may be formed in the lid member 14 in a corresponding area to the, frame portion 15 of the quartz crystal plate 12 so that connection can be made between the electrode film 16 and the lead electrode 18A through the through-hole 19.

Figure 6:
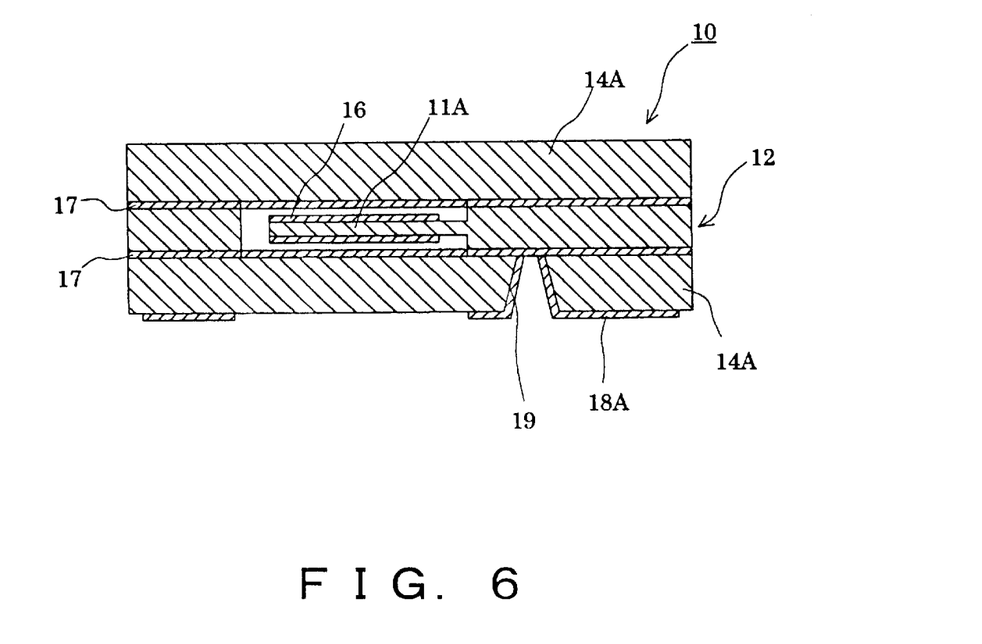
FIG. 6 is a sectional view showing another example of a piezoelectric vibrator according to the invention.

Also, although in the above embodiment a space was defined by the concave portion 13 of the lid member 14 such that the quartz crystal vibration piece 11 is not interfered in vibration, the invention is not limited to this structure. For example, as shown in FIG. 6, the quartz crystal plate 12 for example may be reduced in thickness in an area to be formed into a quartz crystal vibration piece 11A without providing a concave portion in the lid member 14A.

Furthermore, although in the above embodiment the piezoelectric vibration plate was formed of quartz, the invention is not limited to this. Alternatively, it may be formed of ceramic or the like.

With any of these structures, certain and easy bonding is possible between the piezoelectric vibrator and the lid members in a manner as described above.

As explained above, in the present invention, the bonding films of a same material as oscillation electrode films are formed on the top and bottom both surfaces of the piezoelectric vibration plate so that the piezoelectric vibration plate and lid members are anodically bonded through the bonding film. Due to this, the piezoelectric vibration piece can be positively hermetically sealed. Also, the bonding film can be formed in a same process as the oscillation electrode film, providing an effect of simplifying the manufacture process.

What is claimed is:

1. A manufacturing method of a piezoelectric vibrator having a piezoelectric vibration plate formed with a piezoelectric vibration portion and a frame portion integrally connected with the piezoelectric vibration portion and surrounding the piezoelectric vibration portion, on respective surfaces of which a pair of lid members are bonded to hermetically seal the piezoelectric vibration portion without interfering with vibration of the piezoelectric vibration portion, comprising the steps of:

provinding a pair of soda-lime glass lid members;

forming a metal film over substantially entire opposite surfaces of the piezoelectric vibration plate;

forming oscillation electrode films and bonding films at the same time by at the metal film to form the oscillation electrode films on opposite surfaces of the piezoelectric vibration portion for vibrating the piezoelectric vibration portion, and to form the bonding films on opposite surfaces of the frame portion for bonding the frame portion to the pair of lid members; and laminating the piezoelectric vibration plate and the pair of lid members through the bonding films by heating the bonding films to a temperature within the range of 100–200° C. and applying a voltage of 0.5–5.0 kV between the lid members and the bonding films with the piezoelectric vibration plate serving as an anode.

2. The manufacturing method of a piezoelectric vibrator according to claim 1; wherein the lid members are formed of soda-lime glass.

3. The manufacturing method of a piezoelectric vibrator according to claim 1; wherein the metal film is formed of an aluminum alloy.

4. The manufacturing method of a piezoelectric vibrator according to claim 1; wherein the piezoelectric vibration portion and the frame portion form a tuning fork.

5. The manufacturing method of a piezoelectric vibrator according to claim 4; wherein the piezoelectric vibration portion comprises tines of the tuning fork.

6. The manufacturing method of a piezoelectric vibrator according to claim 1; further comprising a step of etching a piezoelectric substrate to form the piezoelectric vibration portion connected to and surrounded by the frame portion.

7. The manufacturing method of a piezoelectric vibrator according to claim 6; wherein the piezoelectric vibration portion comprises a pair of elongate members extending from the frame portion and being symmetrically opposed to each other.

8. The manufacturing method of a piezoelectric vibrator according to claim 1; further comprising a step of etching recesses in the lid members in regions opposed to the piezoelectric vibration portion prior to bonding the lid members to the frame portion so that vibration of the piezoelectric vibration is unimpeded.

9. A manufacturing method of a piezoelectric vibrator having a piezoelectric vibration plate formed with a piezoelectric vibration portion and a frame portion integrally connected with the piezoelectric vibration portion and surrounding the piezoelectric vibration portion, on respective surfaces of which a pair of lid members are bonded to hermetically seal the piezoelectric vibration portion without interfering with vibration of the piezoelectric vibration portion, comprising the steps of:

forming a metal film over substantially entire opposite surfaces of the piezoelectric vibration plate and extending to an edge of the piezoelectric vibration plate;

patterning the metal film to form oscillation electrode films on opposite surfaces of the piezoelectric vibration portion and to simultaneously form bonding films on opposite surfaces of the frame portion for bonding the frame portion to the pair of lid members;

laminating the piezoelectric vibration plate and the pair of lid members through the bonding films by heating the bonding films to a temperature within the range of 100–200° C. and applying a voltage of 0.5–5.0 kV between the lid members and the bonding films with the piezoelectric vibration plate serving as an anode; and forming another metal film extending along an outer surface of one of the lid members and contacting one of the oscillation electrode films formed on the piezoelectric vibration portion to form an electrode.

10. A method of manufacturing a piezoelectric vibrator comprising the steps of:

etching a piezoelectric substrate to form a piezoelectric vibration plate having at least one piezoelectric vibration member for undergoing vibration and a frame portion connected to the piezoelectric vibration member;

forming oscillation electrode films on opposite surfaces of the piezoelectric vibration member of a patterned metal thin film for vibrating the piezoelectric vibration member, and at the same time forming bonding films on opposite surfaces of the frame portion of the patterned metal thin film for bonding the frame portion to a pair of lid members formed of soda-lime glass; and bonding the pair of lid members to opposite surfaces of the frame portion to hermetically seal the piezoelectric vibration member by placing the lid members on the opposite surfaces of the piezoelectric vibration plate with the bonding films disposed therebetween and heating the bonding films while applying a voltage between the lid members and the bonding films with the piezoelectric vibration plate serving as an electrode.

11. The method of manufacturing a piezoelectric vibrator according to claim 10; wherein the piezoelectric vibration member has a base portion connected to the frame portion and an elongate portion extending from the base portion.

12. The method of manufacturing a piezoelectric vibrator according to claim 10; wherein the piezoelectric vibration member and the frame portion form a tuning fork.

13. The method of manufacturing a piezoelectric vibrator according to claim 12; wherein the piezoelectric vibration member comprises a tine of the tuning fork.

14. The method of manufacturing a piezoelectric vibrator according to claim 10; wherein the step of etching comprises etching the piezoelectric substrate to form a pair of piezoelectric vibration members extending from and being surrounded by the frame portion.

15. The method of manufacturing a piezoelectric vibrator according to claim 14; wherein the piezoelectric vibration members are symmetrically opposed to each other.

16. The method of manufacturing a piezoelectric vibrator according to claim 10; further comprising a step of patterning the metal film to form bonding films on opposite surfaces of the frame portion for bonding the air of lid members to the frame portion.

17. The method of manufacturing a piezoelectric vibrator according to claim 10; wherein the piezoelectric substrate comprises one of quartz or a ceramic material.

18. The method of manufacturing a piezoelectric vibrator according to claim 10; wherein the metal film is formed of an aluminum alloy.

19. The method of manufacturing a piezoelectric vibrator according to claim 10; wherein the frame portion surrounds the piezoelectric vibration member.

20. The method of manufacturing a piezoelectric vibrator according to claim 10; wherein the bonding step comprises the step of heating the patterned metal thin film to a temperature within the range of 100–200° C. while applying a voltage of 0.5–5.0 kV between the lid members and the patterned metal thin film with the piezoelectric vibration plate serving as an electrode.

21. A method of manufacturing a piezoelectric vibrator comprising the steps of:

etching a piezoelectric substrate to form a piezoelectric vibration plate having a piezoelectric vibration member for undergoing vibration and a frame portion connected to the piezoelectric vibration member;

forming a metal film on opposite surfaces of the piezoelectric vibration plate to extend to an edge of the piezoelectric vibration plate;

patterning the metal film to form oscillation electrode films on opposite surfaces of the piezoelectric vibration member and to simultaneously form bonding films on opposite surfaces of the frame portion;

bonding a pair of lid members to opposite surfaces of the frame portion to hermetically seal the piezoelectric vibration member by placing the lid members on the opposite surfaces of the piezoelectric vibration plate with the metal film disposed therebetween and heating the metal film while applying a voltage between the lid members and the metal film with the piezoelectric vibration plate serving as an electrode; and forming another metal film extending along an outer surface of one of the lid members and contacting the metal film formed on the piezoelectric vibration member to form an electrode.

* * * * *